United States Patent
Vestøl Endrerud

(10) Patent No.: US 10,902,163 B2
(45) Date of Patent: Jan. 26, 2021

(54) SIMULATION METHOD AND SYSTEM

(71) Applicant: Shoreline AS, Stavanger (NO)

(72) Inventor: Ole Erik Vestøl Endrerud, Tonstad (NO)

(73) Assignee: Shoreline AS, Stavanger (NO)

( * ) Notice: Subject to any disclaimer, the term of this patent is extended or adjusted under 35 U.S.C. 154(b) by 364 days.

(21) Appl. No.: 15/757,209

(22) PCT Filed: Sep. 6, 2016

(86) PCT No.: PCT/EP2016/070970
§ 371 (c)(1),
(2) Date: Mar. 2, 2018

(87) PCT Pub. No.: WO2017/042160
PCT Pub. Date: Mar. 16, 2017

(65) Prior Publication Data
US 2018/0247000 A1    Aug. 30, 2018

Related U.S. Application Data

(60) Provisional application No. 62/215,099, filed on Sep. 7, 2015.

(51) Int. Cl.
| | | |
|---|---|---|
| G06F 30/20 | (2020.01) | |
| G06Q 50/28 | (2012.01) | |
| G06Q 10/06 | (2012.01) | |
| G06Q 10/00 | (2012.01) | |

(Continued)

(52) U.S. Cl.
CPC .......... *G06F 30/20* (2020.01); *G06Q 10/067* (2013.01); *G06Q 10/06313* (2013.01); *G06Q 10/20* (2013.01); *G06Q 50/28* (2013.01); *G06F 3/04847* (2013.01); *G06T 13/80* (2013.01);

(Continued)

(58) Field of Classification Search
USPC .............................................. 703/5, 6, 7, 19
See application file for complete search history.

(56) References Cited

U.S. PATENT DOCUMENTS

| | | | |
|---|---|---|---|
| 8,489,247 B1 | 7/2013 | Engler | |
| 9,995,278 B2 * | 6/2018 | Lund | ...... F03D 7/047 |
| 10,132,295 B2 * | 11/2018 | Lund | ...... F03D 7/048 |

(Continued)

FOREIGN PATENT DOCUMENTS

| | | | |
|---|---|---|---|
| JP | 2002-349413 A | 12/2002 | |
| JP | 2002-365673 A | 12/2002 | |

(Continued)

OTHER PUBLICATIONS

European Office Action for corresponding Patent Application No. 16765947.3 dated Sep. 11, 2019.

(Continued)

*Primary Examiner* — Thai Q Phan
(74) *Attorney, Agent, or Firm* — Renner, Otto, Boisselle & Sklar, LLP

(57) ABSTRACT

A method and a system for simulating physical assets, such as wind farms, solar power plants and manufacturing facilities, comprising the steps of: a) collecting input data; b) setting up a virtual version of a physical asset; c) setting simulation length; d) running simulation according to a simulation algorithm using data collected in step a); and e) generating an output report.

17 Claims, 4 Drawing Sheets

(51) Int. Cl.
*G06F 3/0484* (2013.01)
*G06T 13/80* (2011.01)

(52) U.S. Cl.
CPC ............... *Y02P 80/10* (2015.11); *Y02P 90/80* (2015.11); *Y04S 10/50* (2013.01)

(56) References Cited

U.S. PATENT DOCUMENTS

| | | | | |
|---|---|---|---|---|
| 10,318,903 | B2* | 6/2019 | Johnson | G06Q 10/06313 |
| 10,417,614 | B2* | 9/2019 | Johnson | G06Q 10/20 |
| 10,691,773 | B2* | 6/2020 | Wood | G16H 10/60 |
| 2006/0113801 | A1* | 6/2006 | Schubert | F03D 80/50 290/44 |
| 2010/0049494 | A1* | 2/2010 | Radibratovic | G06Q 10/04 703/13 |
| 2012/0053984 | A1* | 3/2012 | Mannar | G06Q 10/0635 705/7.28 |
| 2012/0139248 | A1* | 6/2012 | Bertolotti | F03D 7/0224 290/44 |
| 2012/0253746 | A1 | 10/2012 | Kolar | |
| 2013/0030784 | A1 | 1/2013 | Viassolo et al. | |
| 2016/0215759 | A1* | 7/2016 | Fleming | F03D 7/048 |
| 2016/0231716 | A1* | 8/2016 | Johnson | G05B 13/041 |
| 2016/0333854 | A1* | 11/2016 | Lund | F01D 21/14 |
| 2016/0333855 | A1* | 11/2016 | Lund | F03D 7/048 |
| 2017/0228478 | A1* | 8/2017 | Alexander-Buckley | G06F 30/20 |
| 2017/0322834 | A1* | 11/2017 | de Sene | H04L 43/045 |
| 2017/0323231 | A1* | 11/2017 | Johnson | G06Q 10/06314 |
| 2017/0323239 | A1* | 11/2017 | Johnson | G06Q 10/0635 |
| 2017/0323274 | A1* | 11/2017 | Johnson | G05B 23/0251 |
| 2019/0121336 | A1* | 4/2019 | Xin | F03D 80/50 |
| 2020/0249074 | A1* | 8/2020 | Diamond | G01H 1/006 |

FOREIGN PATENT DOCUMENTS

| | | |
|---|---|---|
| JP | 2008-083971 A | 4/2008 |
| JP | 2016-093050 A | 5/2016 |
| WO | 2017/042160 A1 | 3/2017 |

OTHER PUBLICATIONS

Kremers, Enrique et al. "Modelling and Simulation of Electrical Energy Systems Through a Complex Systems Approach Using Agent-Based Models" KIT Scientific Publishing, Dec. 31, 2013 (Dec. 31, 2013), p. 202 pgs., XP055407370, Retrieved from the Internet: URL:https://dbkit.bibliothek.kit.edu/uv/getUvkaDocument.php?vv_id=1000031133.

International Search Report and Written Opinion for corresponding Patent Application No. PCT/EP2016/070970 dated Nov. 17, 2016.

* cited by examiner

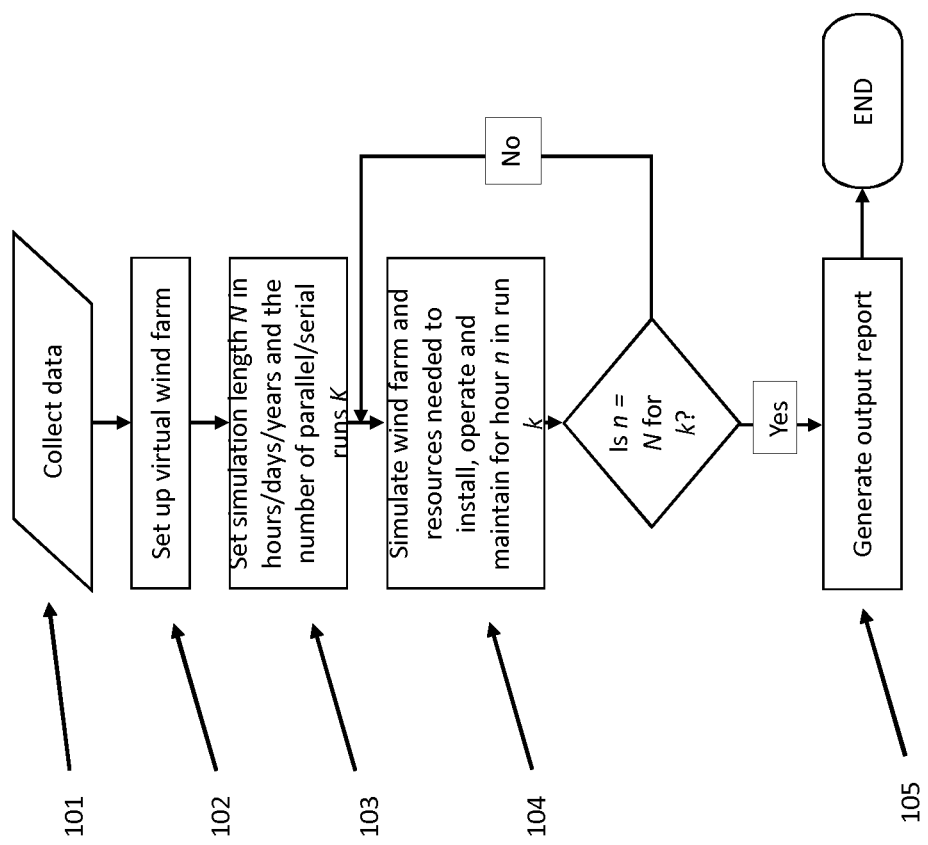
Figure 1 Simulation system general process

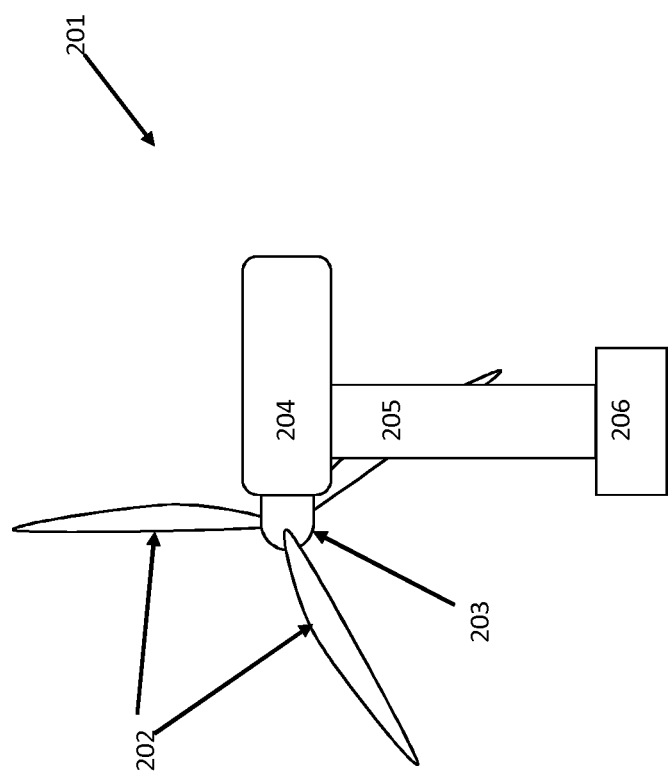
Figure 2 Wind turbine

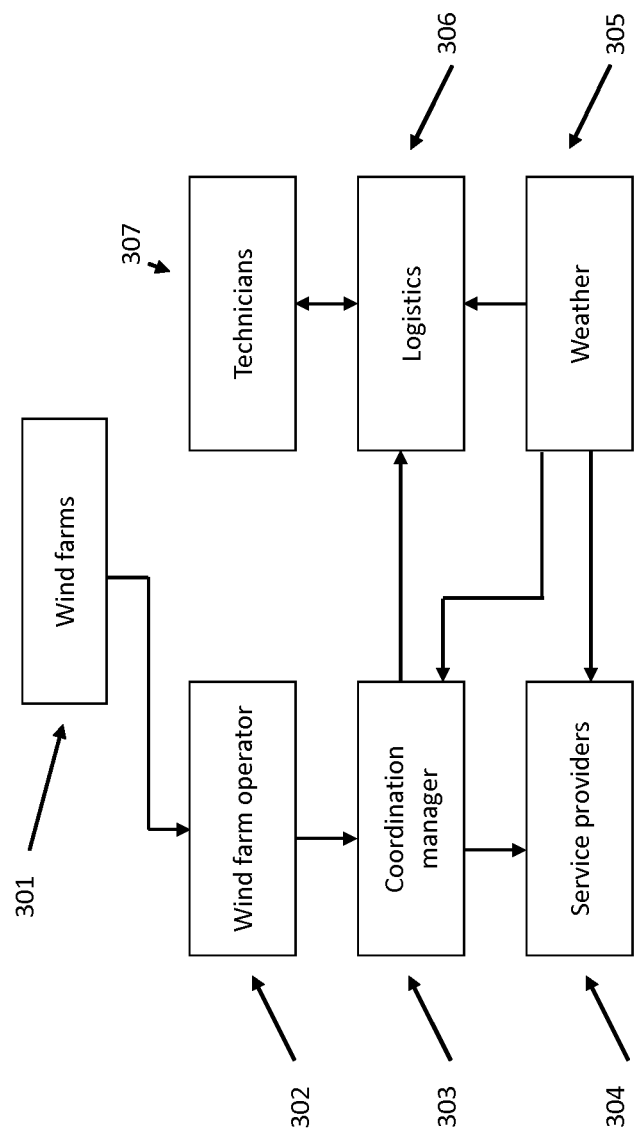
Figure 3 Interactions between parts of the model

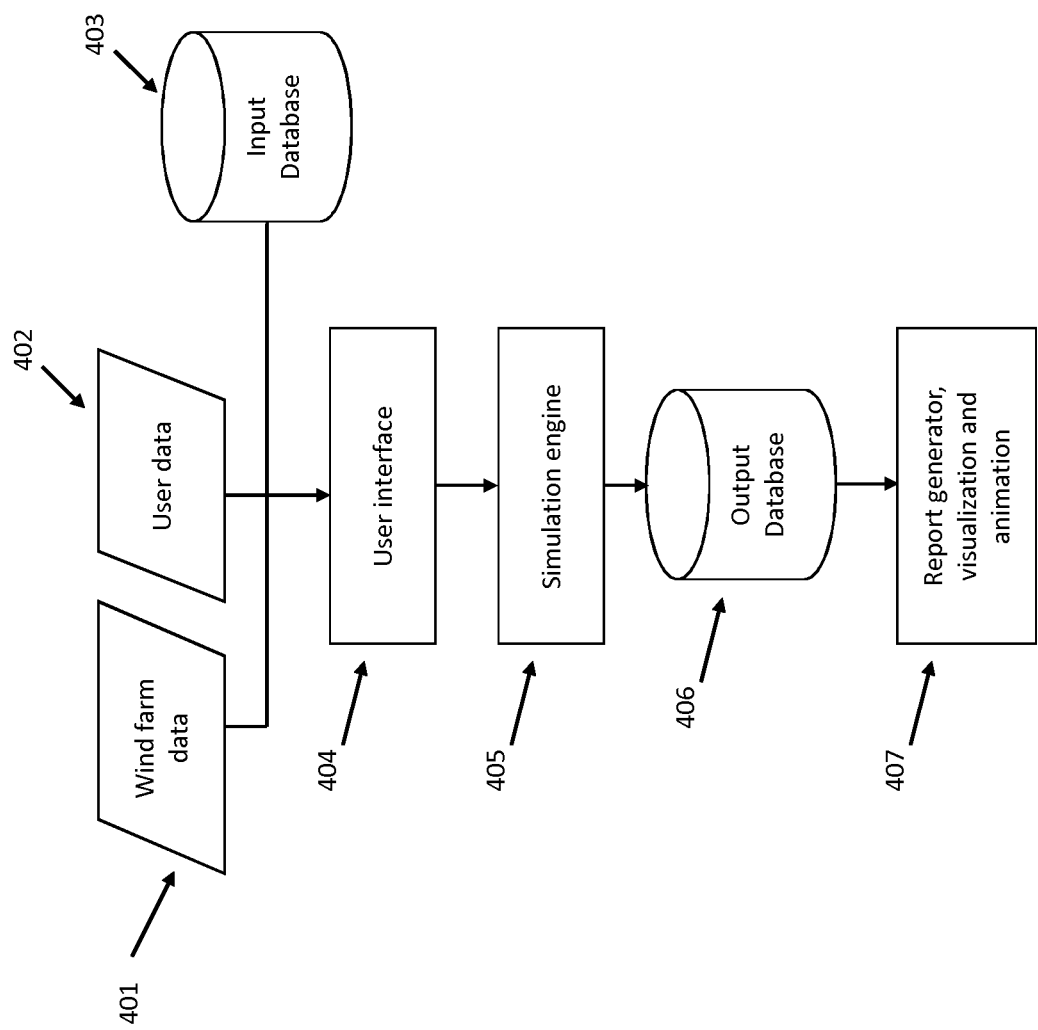
Figure 4 Hardware/software configuration

SIMULATION METHOD AND SYSTEM

This application is a national phase of International Application No. PCT/EP2016/070970 filed Sep. 6, 2016 and published in the English language, which claims the benefit of U.S. Provisional Patent Application No. 62/215,099 filed Sep. 7, 2015, which are hereby incorporated herein by reference.

TECHNICAL FIELD OF THE INVENTION

The present invention relates to a method and a system for simulating physical assets, such as wind farms, solar power plants, manufacturing facilities etc.

BACKGROUND OF THE INVENTION

Wind farm operators require a wind farm to be operated at maximum utilization and performance, but this is not achieved due to unplanned and planned failures and planned work on wind turbines, substations, cables, met masts, and other wind farm assets located in said wind farm. In order to increase the utilization and performance of said wind farm over its lifetime it needs to be constructed, operated and maintained optimally. This is achieved by having optimal operation and maintenance strategies, have the correct number and type of resources available, etc.

Wind farm operators and service providers do not know what the optimal is because no robust method exist that enables understanding why said wind farm is operating below optimum other than experience.

Existing solutions to estimate performance of a wind farm are: ECN O&M Tool, ECN OMCE, and NOWIcob.

ECN O&M Tool is developed by Energy Research Centre Netherlands and is a Microsoft Excel-based spreadsheet tool with a user interface for offshore wind farms that calculates, not simulates, average offshore wind farm performance over the lifetime of said wind farm, typically 25 years. ECN OMCE is developed by Energy Research Centre Netherlands and is an offshore wind Matlab-based simulation tool with a user interface that can estimate the optimal number of vessels and technicians required to operate and maintain an offshore wind farm. It lacks a high level of detail in the simulation. ECN OMCE is not connected to an input database or output database, and is not capable of analyzing wind park behavior.

NOWIcob is developed by Sintef and is an offshore wind Matlab-based simulation tool with a simple user interface that can estimate the optimal number of vessels and technicians required to operate and maintain an offshore wind farm. It lacks a high level of detail in the simulation. NOWIcob is not connected to an input database or output database, and is not capable of analyzing wind park behavior. NOWIcob is capable of generating synthetic weather time series.

In U.S. Pat. No. 8,489,247 a method of controlling operation of at least one wind turbine is described.

US20130030784 describes embodiments for determining an optimal configuration for a renewable energy power plant. Focus in this document is economical modelling of a generator/storage system.

US20120053984 describes a system for use with a risk management system. A maintenance log processor is described.

SUMMARY

It is an objective of the present invention to provide an improved simulation method and system for physical assets, such as wind farms, solar power plants, manufacturing facilities etc.

This is achieved in a method for simulating physical assets, such as wind farms, solar power plants and manufacturing facilities, comprising the steps of:
a) collecting input data;
b) setting up a virtual version of a physical asset;
c) setting simulation length;
d) running simulation according to a simulation algorithm using data collected in step a); and
e) generating an output report.

This is also achieved in a simulation system comprising modules, algorithms and a user interface for performing the method steps.

Hereby collected data is used for the simulation and an output report is generated. This provides a very realistic and detailed simulation.

Suitable embodiments of the invention are described in the dependent claims.

In one embodiment of the invention the input date collected in a) is collected from a user interface or databases.

In one embodiment of the invention the virtual version of a physical asset being set up in b) comprises organization around the physical asset, such as personnel that works in said physical asset, machinery and other installations being part of said physical asset and logistics elements (e.g. vessels, helicopters, vehicles).

In one embodiment of the invention the simulation length set in c) comprises setting simulation run length and number of simulation runs.

In one embodiment the output report in step e) comprises a visualization of results. This could be animation visualization. It could also be GIS, Graphic information system, maps. In one embodiment a user interface is provided with which a user can interact to perform one or more of the following: enter data, set up the virtual wind farm, define simulation scenarios, record results, view results, view animations, view visualizations, generate reports, export results and/or export input data. Hereby a user friendly simulation system is achieved.

In one embodiment of the invention the simulation algorithm in step d) is based on agent-based modeling and discrete event modeling. Hereby a realistic and detailed algorithm is provided.

BRIEF DESCRIPTION OF THE DRAWINGS

FIG. 1 is a flow chart of the simulation system general process according to one embodiment of the invention.

FIG. 2 is a schematic view of a wind turbine.

FIG. 3 is a schematic view of modules of the simulation system according to one embodiment of the invention and how they are interconnected with several algorithms.

FIG. 4 shows the simulation system architecture according to one embodiment of the invention.

DETAILED DESCRIPTION OF THE EMBODIMENTS

The present invention is a simulation system and method for simulation and recording performance and information of physical assets, such as wind farms, solar power plants and manufacturing facilities and resources needed to install, operate and maintain said physical assets over a given number of years. Said simulation system can be applied in all phases of the life cycle of a physical asset: planning and design, installation, operation and decommissioning. In particular, the system uses user or system administrator provided data, and/or data provided from accompanying database, and/or gathers data from for example wind farm supervisory control and data acquisition (SCADA) systems, wind farm condition monitoring (CM) systems and wind farm maintenance logs (in the example when the physical asset is a wind farm). This information is then analyzed and utilized by the system enabling it to help users more effectively plan, design, and/or manage their physical asset, for example a wind farm.

The simulation method according to the invention is, in contrast to some of the prior art methods mentioned in the background chapter, not a control system (e.g. a wind turbine control system that controls for example pitch angles of blades and/or direction of the nacelle) with control algorithms for controlling parts in a real system but instead a method for simulating some or all phases of the life cycle of a physical asset as described above (planning, design, installation, operation and decommissioning). The simulation methods described further below (agent based and discrete modelling) are chosen to suit this purpose.

The present invention provides a method and a system for simulating physical assets such as wind farms, solar power plants and manufacturing facilities. The method comprises the steps of:
 a) collecting input data;
 b) setting up a virtual version of a physical asset;
 c) setting simulation length;
 d) running simulation according to a simulation algorithm using data collected in step a); and
 e) generating an output report.

The input date collected in a) can in one embodiment of the invention be collected from a user interface or databases.

The virtual version of a physical asset being set up in b) comprises in one embodiment of the invention organization around the physical asset, such as personnel that works in said physical asset, machinery and other installations being part of said physical asset and logistics elements (e.g. vessels, helicopters, vehicles).

In one embodiment of the invention the simulation length set in c) comprises setting simulation run length and number of simulation runs.

In one embodiment of the invention the output report in step e) comprises a visualization of results.

In one embodiment of the invention the method further comprises providing a user interface with which a user can interact to perform one or more of the following: enter data, set up the virtual version of a physical asset and the organization around it, define simulation scenarios, record results, view results, view animations, view visualizations, generate reports, export results and/or export input data.

In one embodiment of the invention the simulation algorithm in step d) is based on agent-based modeling and discrete event modeling.

In one embodiment of the invention step a) further comprises generating a time to failure, TTF, for each part of the virtual wind farm.

In one embodiment of the invention step a) comprises collecting data from a user or a database. In one embodiment of the invention step a) comprises collecting physical asset information either from measurements from a real physical asset corresponding to the virtual version of the physical asset set up in b) or from databases. In one embodiment of the invention the physical asset information is data collected from a supervisory control and data acquisition (SCADA) and/or condition monitoring (CM) system.

In one embodiment of the invention step a) comprises collecting weather and metocean information. In one embodiment of the invention step a) comprises collecting resource information relating to maintenance. In one embodiment of the invention the resource information is technician information and logistics around transportation of spare parts and technicians and performing operations.

In one embodiment of the invention step d) further comprises the steps of:
 creating and storing a work order in a simulation module;
 coordinating how the work order is carried out by utilizing resource information relating to maintenance collected in step a).

In one embodiment of the invention step e) further comprises animation visualization.

In one embodiment of the invention step a) comprises collecting data from a maintenance records in place in an operating physical asset, such as for example a wind farm.

In one embodiment of the invention step a) comprises collecting information from the user relating to scheduled maintenance activities.

In one embodiment of the invention step a) further comprises the step of collecting data from a user interface on the installation schedule and installation dependencies between different physical entities in said physical asset (e.g. wind turbines, substations, cables).

In one embodiment of the invention step a) further comprises the step of collecting data from a user interface on the installation activities (e.g. completion, commissioning and testing) needed for different physical entities in said physical assets.

In one embodiment of the invention step a) further comprises the step of collecting data from a user interface or database on components comprising a physical entity part of said physical asset. In one embodiment of the invention step a) further comprises the step of collecting data from a user interface on the failure modes of said physical entities in said physical assets.

In one embodiment of the invention step a) further comprises the step of collecting data from a user interface or database to create virtual versions of logistics units that are saved in a database.

In one embodiment of the invention step d) further comprise running one simulation run only. In one embodiment of the invention step d) further comprise running multiple simulation runs in parallel.

One embodiment of the present invention is a simulation system (see FIGS. 1 and 4) for collecting 101 and preprocessing of wind farm related input data, setting up 102 a virtual wind farm with user inputted data 402, input database data 403 or collected wind farm data 401, setting the simulation run length and number of runs 103, simulation 104 of installation, operation and decommissioning of a wind farm for a predefined number of hours/days/years, and recording, visualization and reporting 105 of output from said simulation. Simulation system process is depicted in FIG. 1 and simulation system architecture is depicted in FIG. 4.

A wind farm is here used as the example but another physical asset could as well be used, such as for example a solar power plant or a manufacturing facility.

A virtual wind farm is a digital representation of a thought, planned, under construction or built wind farm with wind turbines 201 (see FIG. 2) and balance of plant (BoP)

systems such as cables, substations, ports, foundations, and logistics solution, and wind park operator organization with technicians, and service providers, and operation and maintenance strategy and/or installation strategy, and/or decommissioning strategy.

Input data can come from several sources, but most commonly a user 402, a supervisory control and data acquisition (SCADA) and condition monitoring (CM) system and maintenance records in place in an operating wind farm 401, or from an input database 403 which is part of said simulation system.

A wind turbine (shown in FIG. 2) generate electricity by converting kinetic energy from wind into electrical energy by forcing blades 202 to rotate the hub 203 that is connected to a shaft that turn the generator inside the nacelle 204. The amount of electrical energy generated by a wind turbine is typically determined by the nominal power rating or rated power level of the wind turbine and the wind conditions at the site where the wind turbine is located (e.g. terrain, wind speeds, etc.). The nacelle 204 sits on top of a tower 205 that is connected to a transition piece and/or foundation 206. Often multiple wind turbines are co-located in a wind farm in order to generate electrical energy to supply to a grid.

The layout of wind turbines 201 and balance of plant (BoP) systems such as cables, substations, ports, foundations, etc. in a wind farm is specified with latitude and longitude or other geographical information in a geographical information system (GIS) map.

Wind farms can either be located on land whereas they are named onshore wind farms, or located in water whereas they are named offshore wind farms. The difference between onshore and offshore wind farms is the logistics where onshore wind farms require vehicles for logistics and offshore wind farms require vessels and/or helicopters for logistics. The present invention can be used for onshore and offshore wind farms. The present invention can also be used for all other physical assets, such as solar power plants, hydro power plants, subsea production facilities, manufacturing plants, fleet management in general, construction projects in general and decommissioning projects in general.

The simulation system according to the present invention is the only simulation system that can simulate installation, operation and maintenance of physical assets such as for example wind farms at an extremely high level of detail, and thus estimate the behavior of said wind farm with high precision.

The high level of detail combined with input data from the physical asset (SCADA and CM system data) will when for example a wind farm is in the operational life cycle phase enhance the precision of simulation results further due to less uncertainty in input data.

Downtime is the number of hours/days/weeks/months/years that for example a wind turbine/a wind farm is not ready to operate. Downtime is the time between said wind turbine is in a non-operational state until it is brought back to an operational state by wind turbine technicians, coordination manager, wind farm operator or service provider.

Production based and time based availability are two measures of a physical asset's, such as a wind farm's and wind turbine's utilization and performance. Production based availability is the ratio of actual electrical energy produced over a period of time and the electrical energy production for said period of time if all wind turbines worked for said period of time. Time based availability is the fraction of time a wind turbine or all wind turbines in a wind farm has been ready to produce electrical energy.

Wind farm operators and service providers are always trying to achieve the lowest possible operational expenditure (OPEX) per produced unit of electrical energy. OPEX is defined as all direct expenditures the wind farm operator has to operate and maintain said wind farm.

Wind farm operators are always trying to achieve the lowest possible lost production. Lost production is the electrical energy production that is not achieved when the wind speed was between cut in speed and cut out speed of said wind turbine because said wind turbine was not producing.

Root cause for downtime is an important measurement of a simulation run of said simulation system to understand what in the operation and maintenance of said wind farm is causing said production based availability, said time based availability, said lost production, said utilization and said performance. Root cause of downtime measures the number of hours/days/weeks/months/years that a root cause has caused downtime. Root causes are the following but not limited to: waiting for time, waiting for weather, waiting for technicians, waiting for vessels, waiting to be planned, waiting to be handled, waiting due to transit, waiting due to health, safety and environment limitation, etc.

All key performance indicators that can be measured in a real physical asset, such as for example a wind farm can be measured in the virtual version of the physical asset, such as the virtual wind farm.

Wind farm operators want to optimize annual electrical energy production (AEP) and therefore want to optimize operation and maintenance (O&M) during design phases and operating phases of said wind farm life cycle. Optimization of O&M is achieved by using said simulation system to gather data from a database or user or SCADA system or CM system, run single or multiple simulation runs in series or parallel, generate utilization and performance data (output), generate visualization of simulation run/-s, write output to a database.

Operators and owners of physical assets want to limit the cost of constructing and decommissioning of said physical assets, and therefore want to optimize the project schedule, resource allocations, and work processes. Output such as Gantt charts provide input to planning and execution of construction and decommissioning projects.

The simulation system according to the invention consists of several modules that are interconnected with several algorithms, see overview of one embodiment in FIG. 3. This embodiment relates to wind farms. The modules represent actual organizational roles or physical resource assets in the wind farm operator organization, service provider organization and wind farm.

The wind farms module 301 consist of one or several virtual wind farms that each is an array of wind turbines 201 and balance of plant (BoP) systems such as cables, substations, ports, foundations, etc., and each wind turbine and BoP system in all wind farms are represented individually, i.e. with its own parameters and behavior. Each wind turbine and BoP system consists of several subsystems and/or components or maintenance categories with a reliability, where reliability refers to any measure related to the probability of failure, for example but not restricted to failure rates, hazard rates, lifetime distributions, degradation models, etc. A time to failure (TTF) is sampled for each of the subsystems and/or components or maintenance categories that determines at which time step said subsystem or component or maintenance category will move into a failed state and send an alarm to the wind farm operator module 302 that said subsystem or component or maintenance category has occurred. Wind turbines 201 in said wind farms module 301 sends a service request to the wind farm operator module 302 when scheduled maintenance activities needs to be carried out, if any is specified by the user. Said wind turbine 201 will also have a power curve that is electrical energy produced as a function of wind speed at hub height.

Said wind farm operator module 302 will diagnose said alarm from said wind turbine 101 or BoP system. A work order is generated that specifies a maintenance task that is required to solve a service request or an alarm from said wind turbine 201 or said BoP system. A work order contains the following, but not limited to, information: repair time, repair cost, spare part cost, contract ID, failed component, fault severity (fault type classification), needed technicians, waiting time for spare parts, planning time, mobilizing time, etc. Said work order is stored in a list of work orders that the wind farm operator module 302 holds, until the coordination manager module 303 retrieves said work order to start coordinating how the work order is carried out. Said wind farm operator module 302 will have a number of various logistic solutions in the logistics module 306 such as, but not limited to, vehicles, vessels and helicopters that can provide transport for, but not limited to, spare parts and technicians from the technician module 307. Said wind farm operator module 302 will also have a number of technicians (can be of different profession, level of experience, etc.) that can carry out said work orders in said wind farms 301.

Said coordination manager module 303 will coordinate work orders that said wind farm operator module 302 holds in said list of work orders. Said coordination manager module 303 will charter said technicians 307, logistics solutions 306, or other resources from a service provider 304 if such resources are not already in possession of said wind farm operator module 302. Said coordination manager module 303 will look for weather 305 to carry out work orders, look for available technicians 307, look for restrictions that can limit work in said wind farms 301, look for available logistics solution 306, coordinate work between technicians 307, coordinate work between different logistics solutions 306, and other tasks that is relevant for coordinating work in a wind farm.

Weather 305 affects electrical energy production for wind farms 301, restricts operations according to operational limitations for logistical solutions 306 and operational limitations for technicians 307.

Agent based modeling and discrete event modeling are two modeling methodologies used in this invention to model virtual physical assets, such as wind farms 301, wind farm operator 302, coordination manager 303, service providers 304, logistics 306, technicians 307, and work processes that these modules use to perform various tasks. Agent-based modeling is a modeling methodology where objects are modelled with behavior in a state chart, with individual parameters, and other individual characteristics needed to sufficiently represent an object as it appears in the real world. State charts is a way to model how an object can be in different states, and how said object transitions between states after said transitions are triggered by some event. Discrete event modeling is used to model processes that the objects 301, 302, 303, 304, 306 and 307 carry out during a simulation. In said processes work orders are passed through several steps in said work process, that specifies several important parameters regarding the task. Said processes are connected to said objects when objects trigger the start of a work process.

When a simulation run has been running for N time the simulation run is done, and when all simulation runs are done the results are recorded in the output database 406. Results are any key performance indicator (e.g. time based availability, energy based availability, OPEX, root cause of downtime, etc.) that a user wants to measure, and an animation visualization of the simulation run. After recording results in said output database 406 a report is generated with specification of input data used for the simulation runs, results recorded in said output database 406, a visualization of results in graphs, pie charts, or other visual representation of data, and an animation of simulation runs.

The user interface 404 is either a web interface or a graphical user interface on a local machine that the user can interact with to build a virtual wind farm, define simulation scenarios, record results, view results, view animations, view visualizations, generate reports, export results and export input data.

The invention claimed is:

1. A method for simulating a physical asset comprising the steps of:
    collecting input data including components and available assets;
    determining a time to failure for the components based on the input data;
    setting a simulation length;
    running a simulation for the simulation length comprising:
        at the time to failure for each of the components, issuing an alarm indicating failure of the component;
        for each alarm, issuing a work order specifying a maintenance task to address the alarm;
        for each work order:
            identifying selected assets of the available assets to perform the work order; and
            updating the available assets to signify utilization of the selected assets;
    generating and outputting a report including performance indicators for the simulation based on any issued alarms, work orders, and assets utilized.

2. A method according to claim 1, wherein the physical asset is a wind farm.

3. A method according to claim 1, wherein the components and available assets comprise organization around the physical asset including personnel that works in said physical asset, machinery and other installations being part of said physical asset, and logistics elements including vehicles.

4. A method according to claim 1, wherein the simulation length comprises a simulation run length and a number of simulation runs.

5. A method according to claim 1, wherein the report comprises a visualization of results.

6. A method according to claim 1, further comprising providing a user interface with which a user can interact to perform one or more of the following: enter data, set up the simulation, define simulation scenarios, record results, view results, view visualizations, generate reports, export results and/or export input data.

7. A method according to claim 1, where the work order that is issued and the selected assets that are identified are determined using agent-based modeling and discrete event modeling.

8. A method according to claim 1, where the input data is collected from a user interface or a database.

9. A method according to claim 1, where input data is collected from measurements from a real physical asset corresponding to the simulation or from databases.

10. A method according to claim 9, wherein the input data is collected from a supervisory control and data acquisition (SCADA) and/or condition monitoring (CM) system.

11. A method according to claim 1, where the input data includes weather and metocean information.

12. A method according to claim 1, where the input data includes resource information relating to maintenance.

13. A method according to claim 12, where the resource information is technician information and logistics around transportation of spare parts and technicians and performing operations.

14. A method according to claim 1, where the report includes an animation visualization.

15. A method according to claim 1, where the input data is collected from maintenance records in place in an operating physical asset.

16. A method according to claim 1, where the input data is collected from the user relating to scheduled maintenance activities.

17. A simulation system comprising modules, algorithms and a user interface for performing the method steps.

* * * * *